United States Patent
Fan et al.

(10) Patent No.: US 10,473,530 B2
(45) Date of Patent: Nov. 12, 2019

(54) APPARATUS AND METHOD FOR GENERATING TEMPERATURE-INDICATING SIGNAL USING CORRELATED-OSCILLATORS

(71) Applicant: QUALCOMM Incorporated, San Diego, CA (US)

(72) Inventors: Philex Ming-Yan Fan, Cambridge (GB); Richard Nguyen, Ingolstadt (DE); Manjunatha Poojary, Cambridge (GB)

(73) Assignee: Qualcomm Incorporated, San Diego, CA (US)

( * ) Notice: Subject to any disclaimer, the term of this patent is extended or adjusted under 35 U.S.C. 154(b) by 179 days.

(21) Appl. No.: 15/681,020

(22) Filed: Aug. 18, 2017

(65) Prior Publication Data
US 2019/0056274 A1 Feb. 21, 2019

(51) Int. Cl.
*G01K 7/16* (2006.01)
*G01K 7/01* (2006.01)
(Continued)

(52) U.S. Cl.
CPC ........... *G01K 7/16* (2013.01); *G01K 7/015* (2013.01); *G01K 7/32* (2013.01); *G04F 10/005* (2013.01);
(Continued)

(58) Field of Classification Search
CPC .... G01K 2219/00; G01K 15/005; G01K 7/42; G01K 7/32; H03L 1/02; H03L 7/0995;
(Continued)

(56) References Cited

U.S. PATENT DOCUMENTS 5,221,863 A * 6/1993 Motegi .................. H03K 5/133
327/157
5,545,977 A * 8/1996 Yamada .................. G05F 3/245
323/313

(Continued)

FOREIGN PATENT DOCUMENTS

JP 357207833 A * 12/1982
TW 200736589 A 10/2007

OTHER PUBLICATIONS

International Search Report and Written Opinion—PCT/US2018/046812—ISA/EPO—dated Dec. 20, 2018.
(Continued)

*Primary Examiner* — Gail Kaplan Verbitsky
(74) *Attorney, Agent, or Firm* — Loza & Loza, LLP (57) ABSTRACT

A temperature sensor configured to generate a temperature-indicating signal with improved accuracy over a wide temperature range is disclosed. The temperature sensor includes a first oscillator configured to generate a first oscillating signal with a first frequency that varies with a sensed temperature and a reference parameter; a second oscillator configured to generate a second oscillating signal with a second frequency that varies with the reference parameter; and a time-to-digital converter (TDC) configured to generate a digital output indicative of the sensed temperature based on a ratio of the first frequency to the second frequency. Because the first and second frequencies depend on the reference parameter, and the temperature-indicating signal is a function of the ratio of the first and second frequencies, temperature-variation in the reference parameter cancels out in the temperature-indicating signal.

17 Claims, 4 Drawing Sheets

(51) Int. Cl.
    *G01K 7/32*     (2006.01)
    *G04F 10/00*     (2006.01)
    *H03K 3/03*     (2006.01)

(52) U.S. Cl.
    CPC ........ *H03K 3/0315* (2013.01); *G01K 2219/00* (2013.01)

(58) Field of Classification Search
    CPC ...... H01K 3/0315; G05F 3/245; H03K 5/133; H03K 3/0315; H03K 3/027
    USPC ... 370/102, 1, 178, 170, 163, 183, 184, 185; 324/236; 331/18, 23, 46, 57; 327/512, 327/513
    See application file for complete search history.

(56) References Cited

U.S. PATENT DOCUMENTS

| | | | | |
|---|---|---|---|---|
| 5,638,418 | A * | 6/1997 | Douglass | G01K 1/028 374/102 |
| 6,344,775 | B1 * | 2/2002 | Morizuka | H01L 27/082 257/E27.053 |
| 6,695,475 | B2 * | 2/2004 | Yin | G01K 7/203 327/512 |
| 7,180,380 | B2 | 2/2007 | Bienek et al. | |
| 7,581,881 | B2 | 9/2009 | Kim et al. | |
| 7,619,486 | B1 * | 11/2009 | Lesea | H03L 1/022 331/176 |
| 8,136,987 | B2 | 3/2012 | Luria et al. | |
| 8,218,375 | B2 * | 7/2012 | Joo | G11C 5/147 365/189.09 |
| 8,979,362 | B2 * | 3/2015 | Weder | G06K 19/0717 374/1 |
| 9,068,896 | B2 | 6/2015 | Yun et al. | |
| 9,473,149 | B1 * | 10/2016 | Zhang | H03L 1/022 |
| 9,977,453 | B2 * | 5/2018 | Chern | G05F 3/245 |
| 2003/0156622 | A1 | 8/2003 | Gold et al. | |
| 2005/0225415 | A1 * | 10/2005 | Mahony | G01K 7/01 335/302 |
| 2006/0038626 | A1 | 2/2006 | Duval et al. | |
| 2007/0101227 | A1 * | 5/2007 | Ainspan | G01K 1/028 714/745 |
| 2009/0058543 | A1 | 3/2009 | Gyoten et al. | |
| 2012/0140792 | A1 | 6/2012 | Yeh et al. | |
| 2012/0170616 | A1 | 7/2012 | Tsai et al. | |
| 2013/0156069 | A1 * | 6/2013 | Yun | G01K 7/32 374/170 |
| 2015/0241284 | A1 | 8/2015 | Chuang et al. | |
| 2016/0315624 | A1 * | 10/2016 | Tung | H03L 1/022 |
| 2016/0322976 | A1 * | 11/2016 | Chern | G05F 3/245 |
| 2017/0089975 | A1 | 3/2017 | Savoj et al. | |
| 2017/0124477 | A1 * | 5/2017 | Wang | G06N 7/08 |
| 2017/0272060 | A1 * | 9/2017 | Murata | H03K 3/012 |

OTHER PUBLICATIONS

Anand T., et al., "A VCO Based Highly Digital Temperature Sensor with 0.034 ° C./mV Supply Sensitivity," IEEE Journal of Solid-State Circuits, Nov. 2016, vol. 51, No. 11, pp. 2651-2663.

Meijer, G.C.M., et al., "A New Curvature-Corrected Bandgap Reference," IEEE Journal of Solid-State Circuits, Dec. 1982, vol. SC-17, No. 6, pp. 1139-1143.

\* cited by examiner

APPARATUS AND METHOD FOR GENERATING TEMPERATURE-INDICATING SIGNAL USING CORRELATED-OSCILLATORS

BACKGROUND

Field

Aspects of the present disclosure relate generally to temperature sensors, and in particular, to integrated circuit (IC) temperature sensors.

Background

A temperature sensor is useful in many applications. A system-on-chip (SOC) type integrated circuit (IC) may employ one or more temperature sensors to measure temperatures at various cores and control their performance or undertake other measures to protect the IC from harmful effects due to excessive temperatures.

A temperature sensor typically generates a voltage or digital output indicative of the sensed temperature. The temperature sensor uses various components to generate the temperature-indicating signal. Some of these components, which ideally should not vary with temperature, nonetheless vary with temperature. If the temperature variation of such components is not taken into account in generating the temperature-indicating signal, errors may result in the measurement of the temperature.

SUMMARY

The following presents a simplified summary of one or more embodiments in order to provide a basic understanding of such embodiments. This summary is not an extensive overview of all contemplated embodiments, and is intended to neither identify key or critical elements of all embodiments nor delineate the scope of any or all embodiments. Its sole purpose is to present some concepts of one or more embodiments in a simplified form as a prelude to the more detailed description that is presented later.

An aspect of the disclosure relates to an apparatus including a first oscillator configured to generate a first oscillating signal with a first frequency that varies with a sensed temperature and a reference parameter; a second oscillator configured to generate a second oscillating signal with a second frequency that varies with the reference parameter; and a time-to-digital converter (TDC) configured to generate a digital output indicative of the sensed temperature based on a ratio of the first frequency to the second frequency.

Another aspect of the disclosure relates to a method including generating a first oscillating signal with a first frequency that varies with a sensed temperature and a reference parameter; generating a second oscillating signal with a second frequency that varies with the reference parameter; and generating a digital output indicative of the sensed temperature based on a ratio of the first frequency to the second frequency.

Another aspect of the disclosure relates to an apparatus including means for generating a first oscillating signal with a first frequency that varies with a sensed temperature and a reference parameter; means for generating a second oscillating signal with a second frequency that varies with the reference parameter; and means for generating a digital output indicative of the sensed temperature based on a ratio of the first frequency to the second frequency.

To the accomplishment of the foregoing and related ends, the one or more embodiments include the features hereinafter fully described and particularly pointed out in the claims. The following description and the annexed drawings set forth in detail certain illustrative aspects of the one or more embodiments. These aspects are indicative, however, of but a few of the various ways in which the principles of various embodiments may be employed and the description embodiments are intended to include all such aspects and their equivalents.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

A temperature sensor is useful in many applications. A system-on-chip (SOC) type integrated circuit (IC) may employ one or more temperature sensors to measure temperatures at various cores and control their performance and/or undertake other measures to protect the IC from harmful effects due to excessive temperatures.

Figure 1A:
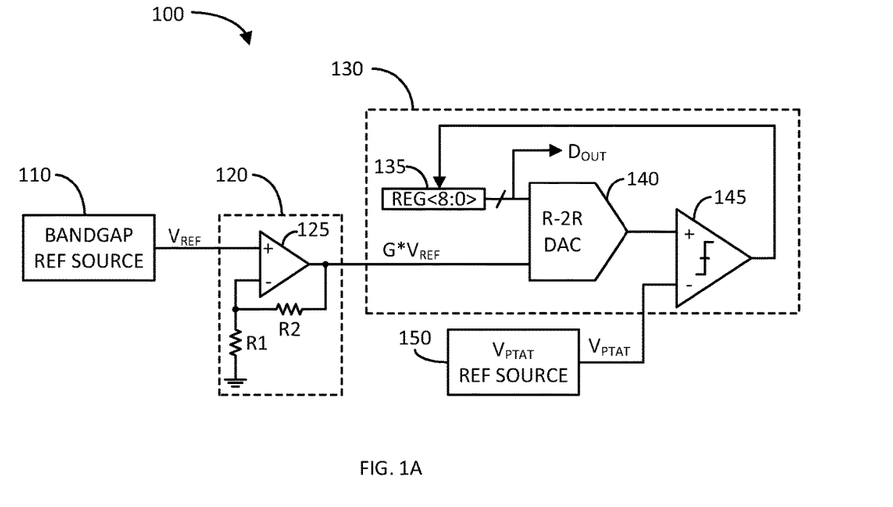
FIG. 1A is a block/schematic diagram of an exemplary temperature sensor in accordance with an aspect of the disclosure.

FIG. 1A illustrates a block/schematic diagram of an exemplary temperature sensor 100. The temperature sensor 100 includes a bandgap reference source 110, an amplification stage 120, an analog-to-digital converter 130 (ADC), and a proportional to absolute temperature (PTAT) reference source 150.

The bandgap reference source 110 is configured to generate a reference voltage $V_{REF}$ that is stable over a wide temperature range (e.g., 0.5% variation over a temperature range of 0° C. to 64° C.).

The amplification stage 120 boosts the reference voltage $V_{REF}$ with a gain G to generate a boosted voltage $G*V_{REF}$.

For proper digitizing of a PTAT voltage $V_{PTAT}$ generated by the $V_{PTAT}$ reference source 150, the boosted voltage $G*V_{REF}$ should be higher than the maximum value of the PTAT voltage $V_{PTAT}$. Thus, this is one reason for the amplification stage 120. The PTAT voltage $V_{PTAT}$ varies substantially proportional to temperature.

The amplification stage 120 may be configured as a positive gain stage, including an operational amplifier 125 with a positive input configured to receive the reference voltage $V_{REF}$ from the bandgap reference source 110, a first resistor R1 coupled between a negative input of the operational amplifier 125 and ground, and a second (feedback) resistor R2 coupled between an output and the negative input of the operational amplifier 125. The boosted voltage $G*V_{REF}$ is generated at the output of the operational amplifier 125.

The ADC 130 may be configured as a successive approximation register (SAR) ADC. That is, the ADC 130 includes a register 135, an R-2R digital-to-analog converter (DAC) 140, and a comparator 145. The R-2R DAC 140 is configured to generate a digital output $D_{OUT}$ based on the PTAT voltage $V_{PTAT}$ by iteratively honing an analog voltage based on n-bit register value towards the PTAT voltage $V_{PTAT}$, where the register value is the digital output $D_{OUT}$ upon completion of all n iterations. The R-2R DAC 140 includes a voltage input configured to receive the boosted reference voltage $G*V_{REF}$. The R-2R DAC 140 includes a digital input configured to receive the value stored in the register 135. In this example, the register is an 8-bit register, but could be any size register depending on the desired resolution for quantizing the PTAT voltage $V_{PTAT}$.

The R-2R DAC 140 includes an output coupled to a positive input of the comparator 145. The PTAT voltage source 150 includes an output configured to produce a PTAT voltage $V_{PTAT}$. The output of the PTAT voltage source 150 is coupled to a negative input of the comparator 145. The comparator 145 includes an output coupled to a control input of the register 135. The output of the register 135 is configured to produce a digital output $D_{OUT}$ indicative of the measured temperature in a region of an IC proximate the $V_{PTAT}$ reference source 150.

The temperature sensor 100 operates as follows: The value stored in the register 135 is initialized to half maximum value (e.g., 10000000). In response, the DAC 140 outputs $½*G*V_{REF}$. The comparator 145 then compares the PTAT voltage $V_{PTAT}$ to $½*G*V_{REF}$ and generates a control signal for the register 135 based on the comparison. If the control signal indicates that $V_{PTAT}$ is lower than $½*G*V_{REF}$, then the register value is changed to 01000000 (i.e., the MSB is assigned a value of 0, and the second MSB is initialized to a value of 1), causing the DAC 140 to output $¼*G*V_{REF}$; if $V_{PTAT}$ is higher than $½*G*V_{REF}$, the register value is changed to 11000000 (i.e., the MSB is assigned a value of 1, and the second MSB is initialized to a value of 1) causing the DAC 140 to output $¾*G*V_{REF}$. In the next iteration, the second MSB of the register value is determined based on a comparison made by the comparator 145, and the third MSB is initialized to a value of 1. The iterations continue until the LSB of the register value is determined. The final register value $D_{OUT}$ is based on $V_{PTAT}$.

The digital output $D_{OUT}$ of the temperature sensor 100 may be determined in accordance with the following relationship:

$$D_{OUT} = \frac{V_{PTAT}}{G*V_{REF}} \times 2^n,$$

where n is the number of bits of the register 135 (e.g., n=8 bits). $D_{OUT}$ is number (e.g., base 2), $2^n$ is a number (e.g., base 10), and the ratio $V_{PTAT}/G*V_{REF}$ is a scalar (i.e., dimensionless). Thus, the units on both sides of the equation match (e.g., both digital numbers).

A drawback of the temperature sensor 100 stems from the use of the reference voltage $V_{REF}$ by the DAC 140 of the SAR ADC 130. Typically, a bandgap source is used to generate the reference voltage $V_{REF}$. A bandgap source is a device for generating a voltage (such as the reference voltage $V_{REF}$ in this case) that is stable with temperature over a defined temperature range. However, outside of the defined temperature range, the reference voltage $V_{REF}$ has a temperature-dependency.

Figure 1B:
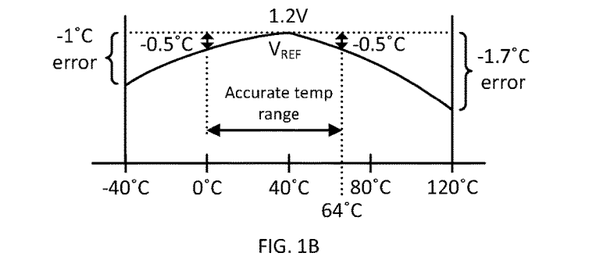
FIG. 1B is a graph of an exemplary reference voltage (V) versus temperature associated with the temperature sensor of FIG. 1A in accordance with another aspect of the disclosure.

FIG. 1B illustrates a graph of the reference voltage $V_{REF}$ over temperature. The temperature sensor 100 may be calibrated or normalized so that the reference voltage $V_{REF}$ produces zero (0) error in the temperature measurement at a specified temperature (e.g., 40° C.). Because of the temperature dependency of $V_{REF}$, the error in the temperature measurement may be −1° C. at a temperature of −40° C. and −1.7° C. at a temperature of 120° C. If the accurate temperature range is defined by the error being 0.5° C. or less, then the accurate temperature range for the temperature sensor 100 is from 0° C. to 64° C. Accordingly, it would be desirable to extend the accurate temperature range.

Other drawbacks include requiring an ADC and a bandgap source to implement the temperature sensing, which are generally costly, consume substantial power, and require complex calibration.

Disclosed herein is a temperature sensor that uses a first ring oscillator configured to generate a first oscillating signal with a reference frequency $f_{REF}$ that varies as a function of a reference current or voltage (e.g., $I_{REF}$ and/or $V_{BP\_IREF}$-$V_{BN\_IREF}$), and a second ring oscillator configured to generate a second oscillating signal with a PTAT frequency $f_{PTAT}$ that varies as a function of a PTAT current or voltage (e.g., $I_{PTAT}$ and/or $V_{BP\_IPTAT}$-$V_{BN\_IPTAT}$), which also varies as a function of the reference current $I_{REF}$.

Additionally, the temperature sensor further includes a time-to-digital converter (TDC) including a first counter configured to generate a first count based on the first oscillating signal, and a second counter configured to generate a second count based on the second oscillating signal during a time window set by the first count. The output $D_{OUT}$ of the second counter provides an indication of the sensed temperature, and may be given by the following relationship:

$$D_{OUT} = \frac{f_{PTAT}}{f_{REF}} \times 2^n = \frac{I_{PTAT}}{I_{REF}} \times 2^n$$

where n is the number of bits of the first counter. Similarly, $D_{OUT}$ is number (e.g., base 2), $2^n$ is a number (e.g., base 10), and the ratios $f_{PTAT}/f_{REF}$ and $I_{PTAT}/I_{REF}$ are a scalar (i.e., dimensionless). Thus, the units on all sides of the equation match (e.g., both digital numbers).

Since the temperature indication $D_{OUT}$ varies as function of the ratio $I_{PTAT}/I_{REF}$, and $I_{PTAT}$ is made to vary as a function of $I_{REF}$, any variation of $I_{REF}$ with temperature tends to cancel out in $D_{OUT}$. Thus, the digital output $D_{OUT}$ substantially varies with temperature solely based on $I_{PTAT}$. Thus, the accurate temperature range of the temperature sensor may be extended.

Additionally, the temperature sensor need not include an ADC or a bandgap reference voltage source. Thus, the temperature sensor consumes substantially less power. Additionally, the ring oscillators may be configured to be virtually identical so that power supply noise cancellation occurs in generating $D_{OUT}$. The aforementioned concepts are explained in more detail with reference to the following embodiments.

Figure 2A:
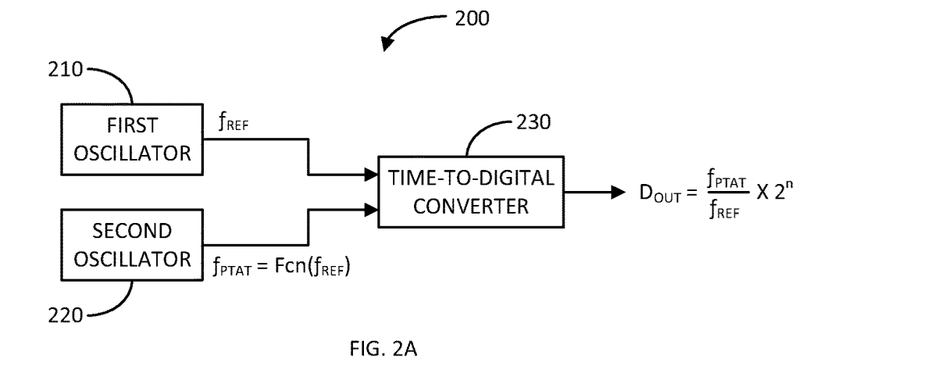
FIG. 2A is a block diagram of another exemplary temperature sensor in accordance with another aspect of the disclosure.

FIG. 2A illustrates a block diagram of an exemplary temperature sensor 200 in accordance with another aspect of the disclosure. The temperature sensor 200 generates a digital output $D_{OUT}$ indicative of a sensed temperature, such as a temperature that may be present in a particular location on an integrated circuit (IC).

In particular, the temperature sensor 200 includes a first oscillator 210, a second oscillator 220, and a time-to-digital converter (TDC) 230. The first oscillator 210 is configured to generate a reference oscillating signal cycling at a frequency $f_{REF}$. The second oscillator 220 is configured to generate a proportional to absolute temperature (PTAT) oscillating signal cycling at a frequency $f_{PTAT}$. The TDC 230 is configured to generate the digital output $D_{OUT}$ varying as a function of $f_{PTAT}/f_{REF}$ (e.g., $D_{OUT}=f_{PTAT}/f_{REF} \times 2^n$, where $2^n$ is the bit resolution of the TDC 230).

The first oscillating signal $f_{REF}$ varies as a function of a reference parameter, such as a reference current or voltage. The second oscillating signal $f_{PTAT}$ varies as a function of temperature (e.g., proportional or in the same direction thereof) and as a function of the reference parameter. Accordingly, the digital output $D_{OUT}$ generated by the TDC 230 varies as a function of temperature (e.g., proportional or in the same direction thereof) due to the second oscillating signal $f_{PTAT}$. However, the temperature-dependency of the first oscillator signal $f_{REF}$ (which may be due to the temperature-dependency of the reference parameter) is substantially cancelled out in generating the digital output $D_{OUT}$ because the numerator and denominator in $f_{PTAT}/f_{REF}$ both vary with the reference parameter.

Figure 2B:
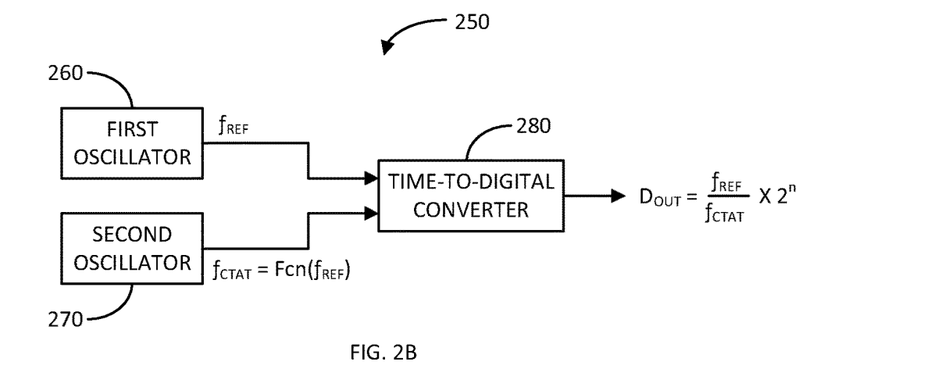
FIG. 2B is a block diagram of another exemplary temperature sensor in accordance with another aspect of the disclosure.

FIG. 2B illustrates a block diagram of another exemplary temperature sensor 250 in accordance with another aspect of the disclosure. The temperature sensor 250 is a variation of temperature sensor 200. In particular, the temperature sensor 250 generates a digital output $D_{OUT}$ indicative of a sensed temperature based on an oscillating signal cycling at a frequency $f_{CTAT}$, which varies complementary to absolute temperature (CTAT) instead of proportional to temperature as in PTAT.

In particular, the temperature sensor 250 includes a first oscillator 260, a second oscillator 270, and a time-to-digital converter (TDC) 280. The first oscillator 260 is configured to generate a reference oscillating signal cycling at a frequency $f_{REF}$. The second oscillator 270 is configured to generate a complementary to absolute temperature (CTAT) oscillating signal cycling at a frequency $f_{CTAT}$. The TDC 280 is configured to generate a digital output $D_{OUT}$ varying as a function of $f_{REF}/f_{CTAT}$ (e.g., $D_{OUT}=f_{REF}/f_{CTAT} \times 2^n$, where $2^n$ is the bit resolution of the TDC 280). In this case, $f_{CTAT}$ is in the denominator so that the digital output $D_{OUT}$ varies is the same direction as temperature.

The first oscillating signal $f_{REF}$ varies as a function of a reference parameter, such as a reference current or voltage. The second oscillating signal $f_{CTAT}$ varies as a function of temperature (e.g., complementary or in inversely with temperature) and as a function of the reference parameter. Accordingly, the digital output $D_{OUT}$ generated by the TDC 280 varies as a function of temperature (e.g., proportional or in the same direction thereof) due to the second oscillating signal $f_{CTAT}$ being in the denominator in the ratio $f_{REF}/f_{CTAT}$. However, the temperature-dependency of the first oscillator signal $f_{REF}$ (which may be due to the temperature-dependency of the reference parameter) is substantially cancelled out in generating the digital output $D_{OUT}$ because the numerator and denominator in $f_{REF}/f_{CTAT}$ both vary with the reference parameter.

Figure 2C:
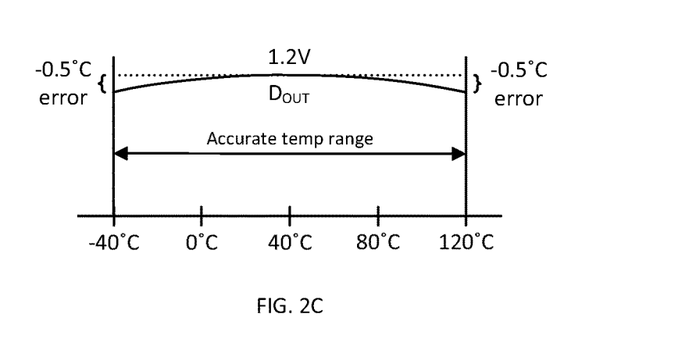
FIG. 2C is a graph of another exemplary reference voltage (V) versus temperature associated with the temperature sensor of FIG. 2A in accordance with another aspect of the disclosure.

FIG. 2C illustrates a graph of an exemplary error in the digital output $D_{OUT}$ versus temperature associated with the temperature sensor 200 or 250 in accordance with another aspect of the disclosure. The graph is similar to the graph depicted in FIG. 1B.

As the graph illustrates, due to the digital output $D_{OUT}$ being a function of the ratio $f_{PTAT}/f_{REF}$ or $f_{REF}/f_{CTAT}$, and $f_{PTAT}$ and $f_{REF}$ or $f_{CTAT}$ and $f_{REF}$ both being a function of the reference parameter, temperature dependency in the reference parameter is substantially cancelled out due to the ratio. Thus, the measurement error in the digital output $D_{OUT}$ is substantially reduced over a wider temperature range. As the graph illustrates, the accurate temperature range associated with temperature sensors 200 and 250, which is defined as having an error of 0.5° C. or less, may extend from −40° C. to 120° C., as compared to 0° C. to 64° C. of temperature sensor 100. Thus, a substantially increase in the accurate temperature range is achieved.

Figure 3:
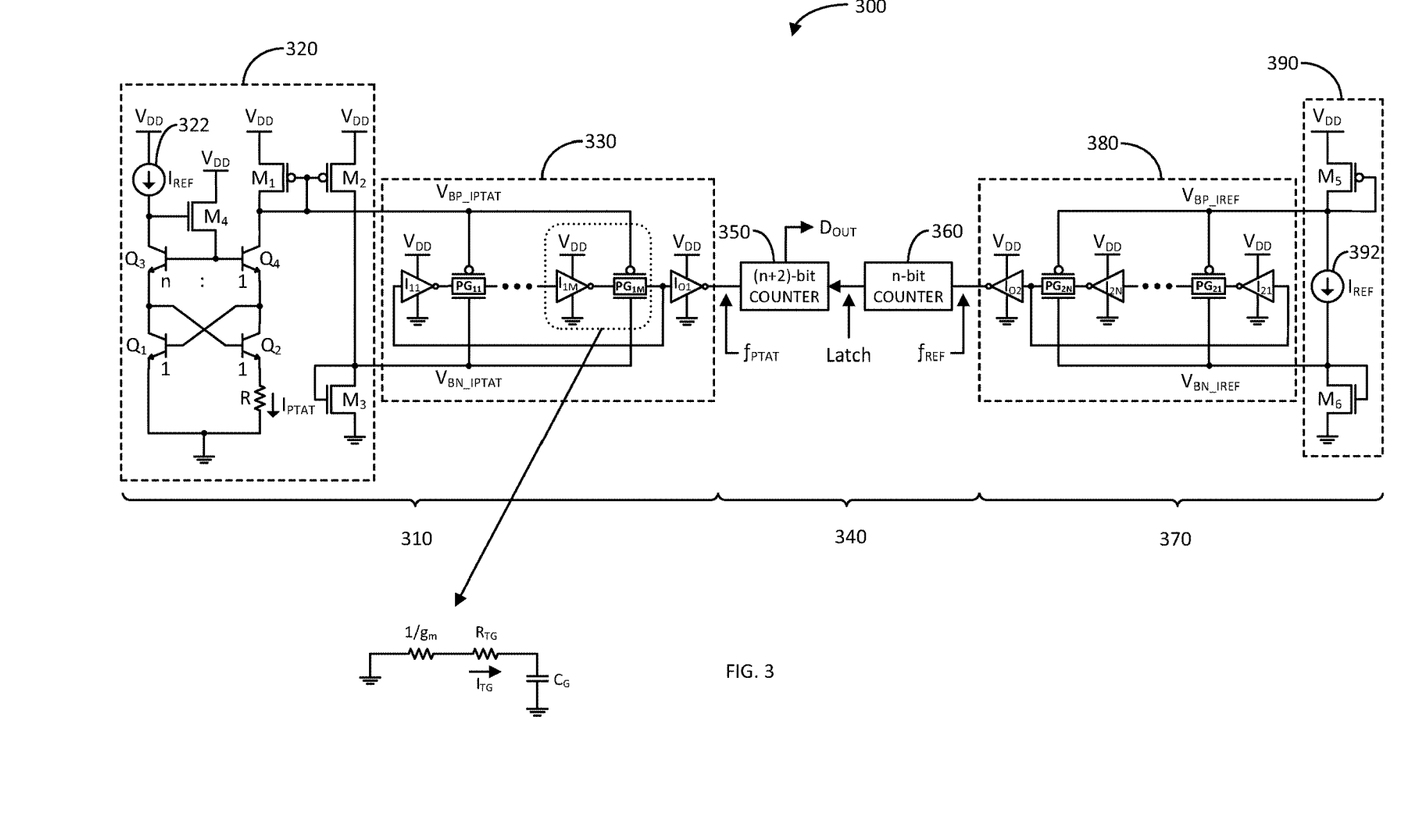
FIG. 3 is a schematic diagram of another exemplary temperature sensor in accordance with another aspect of the disclosure.

FIG. 3 illustrates a schematic diagram of an exemplary temperature sensor 300 in accordance with another aspect of the disclosure. The exemplary temperature sensor 300 may be an exemplary detailed implementation of temperature sensor 200 previously discussed. Using similar concepts as described herein, the temperature sensor 300 may be configured similar to temperature sensor 250 previously discussed.

In particular, the temperature sensor 300 includes a first oscillator 310, a time-to-digital converter (TDC) 340, and a second oscillator 370. The first oscillator 310 is configured to generate a first oscillating signal cycling with a frequency $f_{PTAT}$ that varies with temperature (e.g., proportional or in the same direction thereof) and a reference parameter (e.g., a reference current $I_{REF}$). The second oscillator 370 is configured to generate a second oscillating signal cycling with a frequency $f_{REF}$ that varies with the reference parameter. The TDC 340 is configured to generate a digital output $D_{OUT}$ indicative of a sensed temperature, which is based on the ratio of $f_{PTAT}/f_{REF}$.

More specifically, the first oscillator 310 includes a first bias circuit 320 and a first ring oscillator 330. The first ring oscillator 330 includes an odd number of cascaded inverter-transmission gate pairs $I_{11}$-$PG_{11}$ to $I_{1M}$-$PG_{1M}$ (where M is an odd integer) with an output of the last transmission gate $PG_{1M}$ coupled to an input of the first inverter $I_{11}$. The first ring oscillator 320 further includes a first output inverter $I_{O1}$ including an input coupled to the output of the last transmission gate $PG_{1M}$, and an output at which the first oscillating signal $f_{PTAT}$ is produced.

The inverters $I_{11}$-$I_{1M}$ including the output inverter $I_{O1}$ are coupled between an upper voltage rail $V_{DD}$ and a low voltage rail $V_{SS}$ (e.g., ground). The transmission gates $PG_{11}$ to $PG_{1M}$ include complementary control inputs configured to receive complementary bias voltages $V_{BP\_IPTAT}$ and $V_{BN\_IPTAT}$ generated by the first bias circuit 320, respectively. The complementary bias voltages $V_{BP\_IPTAT}$ and $V_{BN\_IPTAT}$ effectuate the frequency of the first oscillating signal $f_{PTAT}$ to vary with the sensed temperature and the reference parameter.

A controlled delay, implemented by each transmission gate and biases $V_{BP\_IPTAT}$ and $V_{BN\_IPTAT}$, is inserted between adjacent inverters. The effective resistance $R_{TG}$ of each transmission gate affecting an associated time constant $C_G*R_{TG}$ of each stage can be manipulated by $V_{BP\_IPTAT}$ and $V_{BN\_IPTAT}$, which are controlled by $I_{PTAT}$, where $C_G$ is the gate capacitance of each transmission gate. For instance, a higher current $I_{PTAT}$ caused by a higher temperature leads to lower effective resistance $R_{TG}$ of each transmission gate; and consequently, a smaller time constant assuming $C_G$ remains relatively unchanged. Therefore, the smaller time constant results in a higher frequency f. The frequency f may be expressed as follows:

$$f = \frac{1}{2Mt_d} = \frac{g_m}{2MC_G(1+g_mR_{TG})} \approx \frac{I_{TG}}{MC_GV_{DD}} \qquad \text{Eq. 1}$$

where M represents the number of stages of the ring oscillator, $g_m$ is the transconductance of the PMOS or NMOS in each inverter turning on; $V_{DD}$ is the supply voltage, and $I_{TG}$ is the current flowing through each transmission gate. An equivalent circuit of each inverter-transmission gate pair is shown in FIG. 3. The frequency f indicated in Eq. 1 applies to both the first and second ring oscillators 330 and 380, but the effective resistance $R_{TG}$ will most likely be different as $V_{BP\_IPTAT}/V_{PN\_IPTAT}$ of ring oscillator 330 will most likely be different than $V_{BP\_IREF}/V_{BN\_IREF}$ of ring oscillator 380.

Qualitatively, as the sensed temperature increases, the bias voltage $V_{BP\_IPTAT}$ decreases and the bias voltage $V_{BN\_IPTAT}$ increases. As the bias voltage $V_{BP\_IPTAT}$ is applied to the complementary control input (e.g., gate of a p-channel metal oxide semiconductor field effect transistor (PMOS FET) portion) and the bias voltage $V_{BN\_IPTAT}$ is applied to the non-complementary control input (e.g., gate of an n-channel metal oxide semiconductor field effect transistor (NMOS FET) portion) of the transmission gates, the effective resistance of the transmission gates $PG_{11}$ to $PG_{1M}$ to decrease; thereby causing the frequency of the first oscillating signal $f_{PTAT}$ to increase. Similarly, as the sensed temperature decreases, the bias voltage $V_{BP\_IPTAT}$ increases and the bias voltage $V_{BN\_IPTAT}$ decreases. This causes the effective resistance of the transmission gates $PG_{11}$ to $PG_{1M}$ to increase; thereby causing the frequency of the first oscillating signal $f_{PTAT}$ to decrease.

The first bias circuit 320 includes a reference current source 322, bipolar junction transistors (BJTs) $Q_1$, $Q_2$, $Q_3$, and $Q_4$, resistor R, PMOS FETs $M_1$ and $M_2$, and NMOS FET $M_3$ and $M_4$. The current source 322, which is configured to generate a reference current $I_{REF}$, is coupled in series with BJTs $Q_3$ and $Q_1$ between the upper voltage rail $V_{DD}$ and the lower voltage rail $V_{SS}$ (e.g., ground). The NMOS $M_4$ is coupled between the upper voltage rail $V_{DD}$ and the bases of BJTs $Q_3$ and $Q_4$. The PMOS FET $M_1$ is coupled in series with BJTs $Q_4$ and $Q_2$ and resistor R between the upper voltage rail $V_{DD}$ and the lower voltage rail $V_{SS}$ (e.g., ground). The PMOS FET $M_2$ is coupled in series with the NMOS FET $M_3$ between the upper voltage rail $V_{DD}$ and the lower voltage rail $V_{SS}$ (e.g., ground).

The collector of BJT $Q_3$ is coupled to the gate of NMOS FET $M_4$. The collector of BJT $Q_1$ is coupled to the base of BJT $Q_2$. Similarly, the collector of BJT $Q_2$ is coupled to the base of BJT $Q_1$. The gates of the PMOS FETs $M_1$ and $M_2$ are coupled together and to the drain of PMOS FET $M_1$. The drain of NMOS FET $M_3$ is coupled to its gate. The first bias circuit 320 is configured to produce the bias voltage $V_{BP\_IPTAT}$ at the drain of PMOS FET $M_1$ and produce the bias voltage $V_{BN\_IPTAT}$ at the drain of NMOS FET $M_3$.

A PTAT current $I_{PTAT}$ is generated as the collector (or emitter) current of BJT $Q_2$. In the circuit configuration of the first bias circuit 320, the following equation applies in determining $I_{PTAT}$:

$$V_{BE1}+V_{BE4}-V_{BE3}-V_{BE2}=I_{PTAT}\cdot R \qquad \text{Eq. 2}$$

where $V_{BE1}$ is the base emitter voltage of BJT $Q_1$, $V_{BE4}$ is the base emitter voltage of BJT $Q_4$, $V_{BE3}$ is the base emitter voltage of BJT $Q_3$, $V_{BE2}$ is the base emitter voltage of BJT $Q_2$, and R is the resistance of resistor R. The base-emitter voltage of a BJT is given by the following equation:

$$V_{BE} = V_T \ln \frac{I_C}{I_S} \qquad \text{Eq. 3}$$

where $V_T$ is the thermal voltage ($V_T$=kT/q, where k is Boltzmann constant, T is temperature in Kelvin, and q is the electron charge in coulomb), $I_C$ is the collector current of the BJT, and $I_S$ is the saturation current of the BJT. Substituting $V_{BE}$ given in Eq. 3 for $V_{BE1}$ to $V_{BE4}$ in Eq. 2, the following equation may be derived:

$$V_T\left(\ln\frac{I_{C1}}{I_{S1}} + \ln\frac{I_{C4}}{I_{S4}} - \ln\frac{I_{C3}}{I_{S3}} - \ln\frac{I_{C2}}{I_{S2}}\right) = I_{PTAT}\cdot R \qquad \text{Eq. 4}$$

Using logarithmic properties and the fact that the collector current $I_C$ is equal to the emitter current $I_E$ minus the base current $I_B$ (i.e., $I_C=I_E-I_B$), Eq. 4 may be rewritten as follows:

$$V_T\ln\left(\left[\frac{I_{E4}-I_{B4}}{I_{E3}-I_{B3}} \cdot \frac{I_{E1}-I_{B1}}{I_{E2}-I_{B2}}\right]\cdot n\right) = I_{PTAT}\cdot R \qquad \text{Eq. 5}$$

where n is the size ratio between BJTs $Q_3$ and $Q_4$. If the current gain $\beta$ of the BJTs is large (e.g., the base current $I_B$ is negligible compared to the emitter current $I_E$), the emitter current $I_{E4}$ of BJT $Q_4$ is substantially equal to the emitter current $I_{E2}$ of BJT $Q_4$, and the emitter current $I_{E3}$ of BJT $Q_3$ is substantially equal to the emitter current $I_{E1}$ of BJT $Q_2$, Eq. 5 may be rewritten as follows:

$$V_T \ln [n] = I_{PTAT}\cdot R \qquad \text{Eq. 6}$$

Thus, the current $I_{PTAT}$ is proportional to the sensed temperature due to it being proportional to the thermal voltage $V_T$.

In the circuit configuration of the first bias circuit 320, the current $I_{PTAT}$ is made to depend on the reference current $I_{REF}$ generated by the current source 322. That is, a portion of the current $I_{REF}$ generated by the current source 322 flows into the base of BJT $Q_2$ via BJT $Q_3$. The BJT $Q_2$ has a current gain $\beta$ given by $I_C/I_B$, where $I_C$ is the collector current and $I_B$ is the base current of BJT $Q_2$. Since the emitter current $I_{E2}=I_{C2}+I_{B2}$ of BJT $Q_2$ is the same as the current $I_{PTAT}$, and the base current $I_{B2}$ is a portion of the reference current $I_{REF}$, then the current $I_{PTAT}$ varies as a function of the reference current $I_{REF}$ as follows:

$$I_{PTAT} = \frac{V_T}{R}\cdot \ln(n)\cdot f(I_{REF}) \qquad \text{Eq. 7}$$

This $I_{PTAT}$ dependency on $I_{REF}$ allows for widening of the temperature accuracy range of FIG. 1B by self-compensation against temperature shift.

In the first bias circuit 320, the current $I_{REF}$ is made relatively low (e.g., 100 nanoamps (nA)) to reduce the quiescent current, and thus, there is a need to regulate the common base voltage of BJTs $Q_3$ and $Q_4$. In this regard, NMOS FET $M_4$ is provided to reduce or eliminate the beta effect of the BJTs $Q_3$ and $Q_4$. Without NMOS FET $M_4$, the base currents $I_{B3}$ and $I_{B4}$ biased by $I_{REF}$ causes non-linearity of $I_{PTAT}$. The current flow through NMOS FET $M_4$ is around 10 nanoamps (nA). The length of NMOS FET $M_4$ may be designed to be larger than its width to prevent current leakage through the transistor. The effective length of NMOS FET $M_4$ may be chosen/trimmed differently across corners because the base voltages $V_{B1}$, $V_{B2}$, and $V_{B3}$ of BJTs $Q_1$, $Q_2$, and $Q_3$, and the gate voltage $V_g$ of NMOS FET $M_4$ are different in different corners.

The current mirror coupling of the PMOS FET $M_1$ to the PMOS FET $M_2$ causes the $I_{PTAT}$ current to flow through PMOS FET $M_2$ and NMOS FET $M_3$. Thus, if the current $I_{PTAT}$ increases due to a sensed temperature increase, the bias voltage $V_{BP\_IPTAT}$ decreases due to a larger IR drop across PMOS FET $M_1$, and the bias voltage $V_{BN\_IPTAT}$ increases due to a larger IR drop across NMOS FET $M_3$. As discussed above, this causes the frequency of the first oscillating signal $f_{PTAT}$ to increase. Similarly, if the current $I_{PTAT}$ decreases due to a sensed temperature decrease, the bias voltage $V_{BP\_IPTAT}$ increases due to a smaller IR drop across PMOS FET $M_1$, and the bias voltage $V_{BN\_IPTAT}$ decreases due to a smaller IR drop across NMOS FET $M_3$. As discussed above, this causes the frequency of the first oscillating signal $f_{PTAT}$ to decrease. As the current $I_{PTAT}$ is also a function of the current reference $I_{REF}$, changes in the reference current $I_{REF}$ will be reflected as corresponding changes in frequency of the first oscillating signal $f_{PTAT}$.

The second oscillator 370 includes a second bias circuit 390 and a second ring oscillator 380. The second ring oscillator 380 includes an odd number of cascaded inverter-transmission gate pairs $I_{21}$-$PG_{21}$ to $I_{2N}$-$PG_{2N}$ (where N is an odd integer) with an output of the last transmission gate $PG_{2N}$ coupled to an input of the first inverter $I_{21}$. The second ring oscillator 380 further includes a second output inverter $I_{O2}$ including an input coupled to the output of the last transmission gate $PG_{2N}$ and an output at which the first oscillating signal $f_{REF}$ is produced.

The inverters $I_{21}$-$I_{2N}$ including the output inverter $I_{O2}$ are coupled between the upper voltage rail $V_{DD}$ and the lower voltage rail $V_{SS}$ (e.g., ground). The transmission gates $PG_{21}$ to $PG_{2N}$ include complementary control inputs configured to receive complementary bias voltages $V_{BP\_IREF}$ and $V_{BN\_IREF}$ generated by the second bias circuit 390, respectively. The complementary bias voltages $V_{BP\_IREF}$ and $V_{BN\_IREF}$ effectuate the frequency of the second oscillating signal $f_{REF}$ to vary as a function of the reference parameter (e.g., the current reference $I_{REF}$).

The second bias circuit 390 includes a PMOS FET $M_5$ coupled in series with a current source 392 and an NMOS FET $M_6$ between the upper voltage rail $V_{DD}$ and the lower voltage rail $V_{SS}$ (e.g., ground). The gate of PMOS FET $M_5$ is coupled to its drain. Similarly, the gate of NMOS FET $M_6$ is coupled to its drain. The current source 392 is configured to generate substantially the same reference current $I_{REF}$. For example, the current source 392 may be coupled to the current source 322 of the first bias circuit 320 via a current mirror configuration so that the reference currents $I_{REF}$ generated by the current sources 322 and 392 are substantially the same. The complementary bias voltages $V_{BP\_IREF}$ and $V_{BN\_IREF}$ are generated at the drains of the PMOS FET $M_5$ and NMOS FET $M_6$, respectively. As discussed, the voltages $V_{BP\_IREF}$ and $V_{BN\_IREF}$ affect the effective resistance $R_{TG}$ of each transmission gate; and consequently, affect the frequency $f_{REF}$ of the oscillating signal generated by the ring oscillator 380.

Qualitatively, the current reference $I_{REF}$ may have some temperature dependency. For example, if the current reference $I_{REF}$ increases due to a temperature change, the bias voltage $V_{BP\_IREF}$ decreases due to a larger IR drop across PMOS FET $M_5$ and the bias voltage $V_{BN\_IREF}$ increases due to a larger IR drop across NMOS FET $M_6$. This causes the effective resistance of the transmission gates $PG_{21}$ to $PG_{2N}$ to decrease; thereby causing the frequency of the second oscillating signal $f_{REF}$ to increase. Similarly, if the current reference $I_{REF}$ decreases due to a temperature change, the bias voltage $V_{BP\_IREF}$ increases due to a smaller IR drop across PMOS FET $M_5$ and the bias voltage $V_{BN\_IREF}$ decreases due to a smaller IR drop across NMOS FET $M_6$. This causes the effective resistance of the transmission gates $PG_{21}$ to $PG_{2N}$ to increase; thereby causing the frequency of the second oscillating signal $f_{REF}$ to decrease.

The TDC 340 includes a master n-bit counter 360 and a slave (n+2)-bit counter 350. The master n-bit counter 360 is driven by the second oscillating signal $f_{REF}$ generated by the second ring oscillator 370. The master n-bit counter 360 asserts a latch signal when the n-bit counter reaches its maximum count $2^n$. This establishes a time window for counting the cycles of the first oscillating signal $f_{PTAT}$ generated by the first ring oscillator 310.

The latch signal generated by the master n-bit counter 360 is applied to a reset input of the slave (n+2)-bit counter 350. The count $D_{OUT}$ generated by the slave (n+2)-bit counter 350 is driven by the first oscillating signal $f_{PTAT}$. Thus, the count or digital output $D_{OUT}$ generated by the slave (n+2)-bit counter 350 provides an indication of the sensed temperature. As mentioned above, the digital output $D_{OUT}$ may be given by the following equation:

$$D_{OUT} = \frac{f_{PTAT}}{f_{REF}} \times 2^n = \frac{\frac{I_{TG\_PTAT}}{MC_{G1}V_{DD}}}{\frac{I_{TG\_REF}}{NC_{G2}V_{DD}}} = \frac{I_{TG\_PTAT}}{I_{TG\_REF}} \times 2^n \qquad \text{Eq. 8}$$

where $I_{TG\_PTAT}$ is the current through each transmission gate in ring oscillator 330, M is the number of stages in ring oscillator 330, $C_{G1}$ is the gate capacitance of each transmission gate in ring oscillator 330, $I_{TG\_REF}$ is the current through each transmission gate in ring oscillator 380, N is the number of stages in ring oscillator 380, $C_{G2}$ is the gate capacitance of each transmission gate in ring oscillator 380, and $V_{DD}$ is the supply voltage. If the number of stages in both ring oscillators 330 and 380 are the same (i.e., M=N), the gate capacitance $C_{G1}$ of the transmission gate in ring oscillator 330 is the same as the gate capacitance $C_{G2}$ of the transmission gate in ring oscillator 380 (i.e., $C_{G1}$=$C_{G2}$), then digital output $D_{OUT}$ produced by the temperature sensor 300 is given by the right hand side of Eq. 8. In Eq. 8, $D_{OUT}$ is number (e.g., base 2), $2^n$ is a number (e.g., base 10), and the indicated ratios are a scalar (i.e., dimensionless). Thus, the units on all sides of the equation match (e.g., both digital numbers).

As discussed above, as the count $D_{OUT}$ varies as a function of the ratio $I_{PTAT}/I_{REF}$, and $I_{PTAT}$ varies as a function of $I_{REF}$ as indicated in Eq. 7, any variation of $I_{REF}$ due to a temperature change tends to cancel out because of the ratio. Thus, the ≤±0.5° C. accurate temperature range of $D_{OUT}$ may be extended to the range of −20° C. to 90° C. versus 0° C. to 65° C. in other architectures, (from −40° C. to 110° C., the error may be ±1.5° C.), without the use of an ADC and a bandgap reference source. As the first and second ring oscillators 330 and 380 receive the same supply voltage $V_{DD}$, supply noise present in the supply voltage $V_{DD}$ tends to cancel out in generating $D_{OUT}$. This is confirmed by Eq. 8 above, where the supply voltage $V_{DD}$ (including noise) is in both the numerator and denominator in the equation for the digital output $D_{OUT}$, resulting in noise cancellation.

Figure 4:
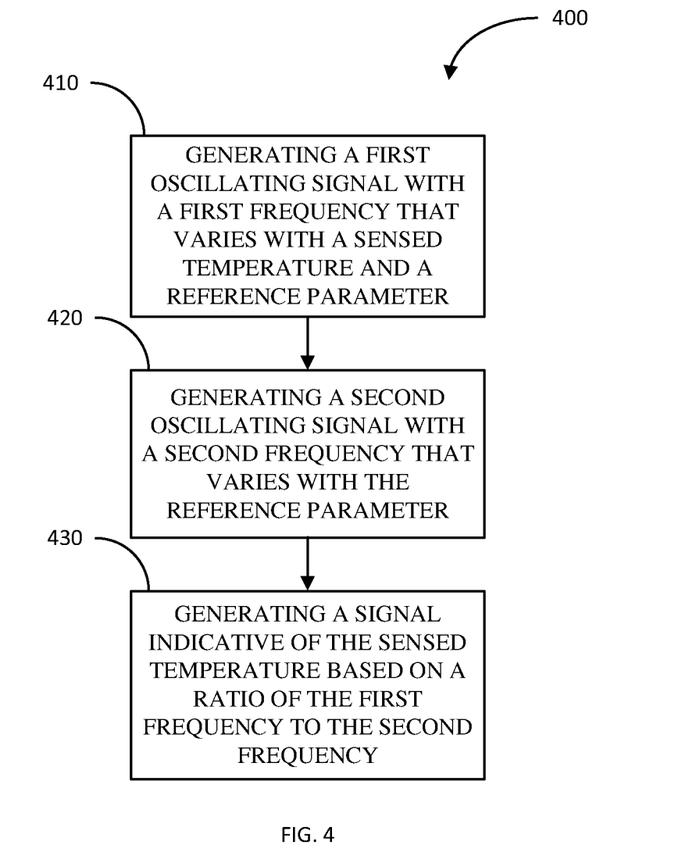
FIG. 4 is a flow diagram of an exemplary method of generating a temperature-indicating signal in accordance with another aspect of the disclosure.

FIG. 4 illustrates a flow diagram of an exemplary method 400 of generating a temperature-indicating signal in accordance with an aspect of the disclosure.

The method 400 includes generating a first oscillating signal with a first frequency that varies with a sensed temperature and a reference parameter (block 410). An example of means for generating a first oscillating signal with a first frequency that varies with a sensed temperature and a reference parameter includes the first oscillator 310.

The method 400 further includes generating a second oscillating signal with a second frequency that varies with the reference parameter (block 420). An example of means for generating a second oscillating signal with a second frequency that varies with the reference parameter includes the second oscillator 370.

Additionally, the method 400 includes generating a signal indicative of the sensed temperature based on a ratio of the first frequency to the second frequency (block 430). An example of means for generating a signal indicative of the sensed temperature based on a ratio of the first frequency to the second frequency includes the time-to-digital converter (TDC) 340.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed is:

1. An apparatus, comprising:
   a first oscillator configured to generate a first oscillating signal with a first frequency that varies with a sensed temperature and a reference parameter, wherein the first oscillator comprises:
     a set of cascaded series-connected inverter-transmission gate pairs including a first inverter-transmission gate pair and a last inverter-transmission gate pair, wherein an output of the last inverter-transmission gate pair is coupled to an input of the first inverter-transmission gate pair; and
     a bias circuit configured to generate complementary bias voltages for complementary control inputs of each of the transmission gates, wherein a difference between the complementary bias voltages varies with the sensed temperature and the reference parameter;
   a second oscillator configured to generate a second oscillating signal with a second frequency that varies with the reference parameter; and
   a time-to-digital converter (TDC) configured to generate a digital output indicative of the sensed temperature based on a ratio of the first frequency to the second frequency.

2. The apparatus of claim 1, wherein the first frequency of the first oscillating signal is based on a proportional to absolute temperature (PTAT) parameter.

3. The apparatus of claim 1, wherein the first frequency of the first oscillating signal is based on a complementary to absolute temperature (CTAT) parameter.

4. The apparatus of claim 1, wherein the reference parameter comprises a first reference current, wherein the bias circuit comprises a circuit configured to generate a proportional to absolute temperature (PTAT) current that varies as a function of the first reference current, and wherein the complementary bias voltages vary as a function of the PTAT current.

5. The apparatus of claim 4, wherein the circuit comprises:
   a first series path coupled between an upper voltage rail and a lower voltage rail, wherein the first series path comprises a current source, a first bipolar junction transistor (BJT), and a second BJT, wherein the current source is configured to generate the first reference current;
   a second series path coupled between the upper voltage rail and the lower voltage rail, wherein the second series path comprises a first p-channel metal oxide semiconductor field effect transistor (PMOS FET), a third BJT, a fourth BJT, and a resistor;
   wherein an emitter of the first BJT is coupled to a base of the fourth BJT, wherein an emitter of the third BJT is coupled to a base of the second BJT, and wherein the resistor is coupled between the emitter of the fourth BJT and the lower voltage rail;
   a first n-channel metal oxide semiconductor field effect transistor (NMOS FET) coupled between the upper voltage rail and the bases of the first and third BJTs, wherein a gate of the first NMOS FET is coupled to a collector of the first BJT;
   a third series path coupled between the upper voltage rail and the lower voltage rail, wherein the third series path comprises a second PMOS FET and a second NMOS FET, wherein a gate of the second PMOS FET is coupled to gate and drain of the first PMOS FET, and wherein the drain of the second NMOS FET is coupled to the gate of the second NMOS FET;
   wherein the complementary bias voltages are generated at the drains of the first PMOS FET and the second NMOS FET, respectively.

6. The apparatus of claim 4, wherein the second oscillator comprises
   a ring oscillator including a set of cascaded series-connected inverter-transmission gate pairs including a first inverter-transmission gate pair and a last inverter-transmission gate pair, wherein an output of the last inverter-transmission gate pair is coupled to an input of the first inverter-transmission gate pair; and
   a bias circuit configured to generate complementary bias voltages for complementary control inputs of each of the transmission gates, wherein a difference between the complementary bias voltages varies with the reference parameter;
   wherein the reference parameter comprises a second reference current, wherein the bias circuit comprises a PMOS FET, a current source, and an NMOS FET coupled in series between an upper voltage rail and a lower voltage rail, wherein the current source is configured to generate the second reference current, wherein the second reference current is substantially identical to the first reference current, and wherein the complementary voltages are generated at drains of the PMOS FET and NMOS FET, respectively.

7. The apparatus of claim 4, wherein the digital output is based on a ratio of the PTAT current to the first reference current.

8. The apparatus of claim 1, wherein the TDC comprises:
a first counter configured to establish a time window based on the second oscillating signal; and
a second counter configured to generate the digital output based on a number of cycles of the first oscillating signal that occur within the time window.

9. The apparatus of claim 8, wherein the first counter is configured to assert a latch signal every $2^n$ cycles of the first oscillating signal, and wherein the time window is based on a duration between adjacent asserted latch signals.

10. A method comprising:
generating a first oscillating signal with a first frequency that varies with a sensed temperature and a reference parameter, wherein generating the first oscillating signal comprises applying complementary bias voltages to a set of transmission gates coupled between a set of inverters, respectively, wherein the complementary bias voltages vary with the sensed temperature and the reference parameter;
generating a second oscillating signal with a second frequency that varies with the reference parameter; and
generating a signal indicative of the sensed temperature based on a ratio of the first frequency to the second frequency.

11. The method of claim 10, wherein the first frequency of the first oscillating signal is based on a proportional to absolute temperature (PTAT) parameter.

12. The method of claim 10, wherein the first frequency of the first oscillating signal is based on a complementary to absolute temperature (CTAT) parameter.

13. The method of claim 10, wherein generating the second oscillating signal comprises applying complementary bias voltages to a set of transmission gates coupled between a set of inverters, respectively, wherein the complementary bias voltages vary with the reference parameter.

14. An apparatus comprising:
means for generating a first oscillating signal with a first frequency that varies with a sensed temperature and a reference parameter, wherein the means for generating the first oscillating signal comprises:
a ring oscillator comprising:
a set of inverters;
a set of transmission gates situated between the set of inverters, respectively; and
means for applying complementary bias voltages to the set of transmission gates, wherein the complementary bias voltages vary with the sensed temperature and the reference parameter;
means for generating a second oscillating signal with a second frequency that varies with the reference parameter; and
means for generating a signal indicative of the sensed temperature based on a ratio of the first frequency to the second frequency.

15. The apparatus of claim 14, wherein the first frequency of the first oscillating signal is based on a proportional to absolute temperature (PTAT) parameter.

16. The apparatus of claim 14, wherein the first frequency of the first oscillating signal is based on a complementary to absolute temperature (CTAT) parameter.

17. The apparatus of claim 14, wherein the means for generating the second oscillating signal comprises:
a ring oscillator comprising:
a set of inverters;
a set of transmission gates situated between the set of inverters, respectively; and
means for applying complementary bias voltages to the set of transmission gates, wherein the complementary bias voltages vary with the reference parameter.

* * * * *